United States Patent
Cok

(10) Patent No.: US 8,174,187 B2
(45) Date of Patent: May 8, 2012

(54) LIGHT-EMITTING DEVICE HAVING IMPROVED LIGHT OUTPUT

(75) Inventor: Ronald S. Cok, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 1052 days.

(21) Appl. No.: 11/623,155

(22) Filed: Jan. 15, 2007

(65) Prior Publication Data

US 2008/0169758 A1 Jul. 17, 2008

(51) Int. Cl.
*H01J 1/62* (2006.01)
*H01J 63/04* (2006.01)
(52) U.S. Cl. ......... 313/506; 313/498; 313/504; 313/512
(58) Field of Classification Search .......... 313/498–512, 313/112
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 5,061,569 A | 10/1991 | Van Slyke et al. | |
| 5,247,190 A | 9/1993 | Friend et al. | |
| 5,955,837 A | 9/1999 | Horikx et al. | |
| 6,226,890 B1 | 5/2001 | Boroson et al. | |
| 6,268,695 B1 | 7/2001 | Affinito | |
| 6,392,340 B2 | 5/2002 | Yoneda et al. | |
| 6,413,645 B1 | 7/2002 | Graff et al. | |
| 6,522,067 B1 | 2/2003 | Graff et al. | |
| 6,777,871 B2 | 8/2004 | Duggal et al. | |
| 6,787,796 B2 | 9/2004 | Do et al. | |
| 2001/0026124 A1 | 10/2001 | Liu et al. | |
| 2003/0127973 A1* | 7/2003 | Weaver et al. | 313/504 |
| 2004/0061136 A1 | 4/2004 | Tyan et al. | |
| 2004/0217702 A1 | 11/2004 | Garner et al. | |
| 2005/0018431 A1 | 1/2005 | Shiang | |
| 2005/0194896 A1* | 9/2005 | Sugita et al. | 313/506 |
| 2005/0269944 A1* | 12/2005 | Su et al. | 313/504 |

(Continued)

FOREIGN PATENT DOCUMENTS

WO 01/82390 11/2001

(Continued)

OTHER PUBLICATIONS

Modification of Polymer Light Emission by Lateral Microstructure, by Safonov et al., Synthetic Metals 116, 2001, pp. 145-148.
Bragg Scattering from Periodically Microstructured Light Emitting Diodes, by Lupton et al., Applied Physics Letters, vol. 77 No. 2, Nov. 20, 2000, pp. 3340-3342.

(Continued)

*Primary Examiner* — Joseph L Williams
*Assistant Examiner* — Kevin Quarterman
(74) *Attorney, Agent, or Firm* — Morgan, Lewis & Bockius LLP

(57) ABSTRACT

A light-emitting OLED device that includes one or more light-emitting OLED elements also includes first and second spaced-apart electrodes with one or more light-emitting organic layers formed there-between, at least one light-emitting organic layer being a light-emitting layer. At least one of the electrodes is a transparent electrode. A first hermetic inorganic encapsulating layer is formed over the transparent electrode opposite the light-emitting organic layer. A light-scattering layer is formed over the first hermetic inorganic encapsulating layer opposite the transparent electrode. An organic encapsulating layer is formed over the light-scattering layer opposite the first hermetic inorganic encapsulating layer. Finally, a second hermetic inorganic encapsulating layer is formed over the organic encapsulating layer opposite the light-scattering layer.

18 Claims, 11 Drawing Sheets

U.S. PATENT DOCUMENTS

| | | | |
|---|---|---|---|
| 2006/0087230 A1* | 4/2006 | Ghosh et al. | 313/512 |
| 2006/0244371 A1* | 11/2006 | Cok et al. | 313/506 |
| 2007/0063628 A1* | 3/2007 | Cok et al. | 313/110 |
| 2007/0200492 A1* | 8/2007 | Cok et al. | 313/506 |

FOREIGN PATENT DOCUMENTS

| | | |
|---|---|---|
| WO | 02/37568 | 5/2002 |
| WO | 02/37580 | 5/2002 |
| WO | 03/090260 | 10/2003 |
| WO | 2004/105149 | 12/2004 |

OTHER PUBLICATIONS

Sharply Directed Emission in Organic Electroluminescent Diodes with an Optical-Microcavity Structure, by Tsutsui et al., Applied Physics Letters, 65, No. 15, Oct. 10, 1994, pp. 1868-1870.
Applied Physics Letter 51,913—1987, Tang et al.
Journal of Applied Physics, 65,3610—1989, Tan, et al.
U.S. Appl. No. 11/065,082, filed Feb. 24, 2005, Cok et al.

* cited by examiner

LIGHT-EMITTING DEVICE HAVING IMPROVED LIGHT OUTPUT

FIELD OF THE INVENTION

The present invention relates to organic light-emitting diode (OLED) devices, and more particularly, to OLED device structures for improving light output and lifetime.

BACKGROUND OF THE INVENTION

Organic light-emitting diodes (OLEDs) are a promising technology for flat-panel displays and area illumination lamps. The technology relies upon thin-film layers of organic materials coated upon a substrate. OLED devices generally can have two formats known as small molecule devices such as disclosed in U.S. Pat. No. 4,476,292, issued Oct. 9, 1984 to Ham et al., and polymer OLED devices such as disclosed in U.S. Pat. No. 5,247,190, issued Sep. 21, 1993 to Friend et al. Either type of OLED device may include, in sequence, an anode, an organic EL element, and a cathode. The organic EL element disposed between the anode and the cathode commonly includes an organic hole-transporting layer (HTL), an emissive layer (EL) and an organic electron-transporting layer (ETL). Holes and electrons recombine and emit light in the EL layer. Tang et al. (Applied Physics Letter, 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EL can determine how efficiently the electrons and holes be recombined and result in the emission of light, etc.

OLED devices can employ a variety of light-emitting organic materials patterned over a substrate that emit light of a variety of different frequencies, for example red, green, and blue, to create a full-color display. However, patterned deposition is difficult, requiring, for example, expensive metal masks. Alternatively, it is known to employ a combination of emitters, or an unpatterned broad-band emitter, to emit white light together with patterned color filters, for example red, green, and blue, to create a full-color display. The color filters may be located on the substrate, for a bottom-emitter, or on the cover, for a top-emitter. For example, U.S. Pat. No. 6,392,340, issued May 21, 2002 to Yoneda et al., illustrates such a device. However, such designs are relatively inefficient since approximately two thirds of the light emitted may be absorbed by the color filters.

It has been found that one of the key factors that limits the efficiency of OLED devices is the inefficiency in extracting the photons generated by the electron-hole recombination out of the OLED devices. Due to the relatively high optical indices of the organic and transparent electrode materials used, most of the photons generated by the recombination process are actually trapped in the devices due to total internal reflection. These trapped photons never leave the OLED devices and make no contribution to the light output from these devices. Because light is emitted in all directions from the internal layers of the OLED, some of the light is emitted directly from the device, and some is emitted into the device and is either reflected back out or is absorbed, and some of the light is emitted laterally and trapped and absorbed by the various layers comprising the device. In general, up to 80% of the light may be lost in this manner.

A typical OLED device uses a glass substrate, a transparent conducting anode such as indium-tin-oxide (ITO), a stack of organic layers, and a reflective cathode layer. Light generated from such a device may be emitted through the glass substrate. This is commonly referred to as a bottom-emitting device. Alternatively, a device can include a substrate, a reflective anode, a stack of organic layers, and a top transparent cathode layer. Light generated from such an alternative device may be emitted through the top transparent electrode. This is commonly referred to as a top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions.

In any of these OLED structures, the problem of trapped light remains. Referring to FIG. 7, a bottom-emitting OLED device as known in the prior art is illustrated having a substrate 10 (in this case transparent), a transparent first electrode 12, one or more layers 14 of organic material, one of which is light-emitting, a reflective second electrode 16, a gap 19 and a cover 20. First electrode 12, the one or more layers 14 of organic material, and reflective second electrode 16 form a light-emitting element 8. The gap 19 is typically filled with desiccating material. Light emitted from one of the organic material layers 14 can be emitted directly out of the device, through the transparent substrate 10, as illustrated with light ray 1. Light may also be emitted and internally guided in the transparent substrate 10 and organic layers 14, as illustrated with light ray 2. Additionally, light may be emitted and internally guided in the layers 14 of organic material, as illustrated with light ray 3. Light rays 4 emitted toward the reflective electrode 16 are reflected by the reflective first electrode 12 toward the substrate 10 and follow one of the light ray paths 1, 2, or 3. In some prior-art embodiments, the electrode 16 may be opaque and/or light absorbing. This OLED display embodiment has been commercialized, for example in the Eastman Kodak LS633 digital camera. The bottom-emitter embodiment shown may also be implemented in a top-emitter configuration with a transparent cover and top electrode 16.

It is also well known that OLED materials are subject to degradation in the presence of environmental contaminants, in particular moisture. Organic light-emitting diode (OLED) display devices typically require humidity levels below about 1000 parts per million (ppm) to prevent premature degradation of device performance within a specified operating and/or storage life of the device. Control of the environment to this range of humidity levels within a packaged device is typically achieved by encapsulating the device with an encapsulating layer and/or by sealing the device, and/or providing a desiccant within a cover. Desiccants such as, for example, metal oxides, alkaline earth metal oxides, sulfates, metal halides, and perchlorates are used to maintain the humidity level below the above level. See for example U.S. Pat. No. 6,226,890, issued May 8, 2001 to Boroson et al. describing desiccant materials for moisture-sensitive electronic devices. Such desiccating materials are typically located around the periphery of an OLED device or over the OLED device itself.

In alternative approaches, an OLED device is encapsulated using thin multi-layer coatings of moisture-resistant material. For example, layers of inorganic materials such as metals or metal oxides separated by layers of an organic polymer may be used as shown in prior-art FIG. 8. Referring to FIG. 8, a light-emitting element 8 is formed on a substrate 10. Alternating layers of organic material 40 and inorganic material 42 are formed over the light-emitting element 8 to protect the light-emitting element 8 from environmental contamination. Such coatings have been described in, for example, U.S. Pat. No. 6,268,695, issued Jul. 31, 2001 to Affinito, U.S. Pat. No. 6,413,645 issued Jul. 2, 2002 to Graff et al, and U.S. Pat. No. 6,522,067 issued Feb. 18, 2003 to Graff et al. A deposition apparatus is further described in WO2003/090260, entitled "Apparatus for Depositing a Multilayer Coating on Discrete Sheets", published Oct. 20, 2003, by Pagano et al. WO2001/082390 entitled "Thin-Film Encapsulation of Organic Light-Emitting Diode Devices", published Nov. 1, 2001 by Ghosh et al., describes the use of first and second thin-film encapsulation layers made of different materials wherein one of the thin-film layers is deposited at 50 nm using atomic layer deposition (ALD) discussed below. According to this disclosure, a separate protective layer is also employed, e.g. parylene and/or $SiO_2$. Such thin multi-layer coatings typically attempt to provide a moisture permeation rate of less than $5\times10^{-6}$ gm/m$^2$/day to adequately protect the OLED materials. In contrast, typically polymeric materials have a moisture permeation rate of approximately 0.1 gm/m$^2$/day and cannot adequately protect the OLED materials without additional moisture blocking layers. With the addition of inorganic moisture blocking layers, 0.01 gm/m$^2$/day may be achieved and it has been reported that the use of relatively thick polymer smoothing layers with inorganic layers may provide the needed protection. Thick inorganic layers, for example 5 microns or more of ITO or ZnSe, applied by conventional deposition techniques such as sputtering or vacuum evaporation may also provide adequate protection, but thinner conventionally coated layers may only provide protection of 0.01 gm/m$^2$/day. WO2004/105149 entitled "Barrier Films for Plastic Substrates Fabricated by Atomic Layer Deposition" published Dec. 2, 2004 by Carcia et al., describes gas permeation barriers that can be deposited on plastic or glass substrates by atomic layer deposition (ALD). Atomic Layer Deposition is also known as Atomic Layer Epitaxy (ALE) or atomic layer CVD (ALCVD), and reference to ALD herein is intended to refer to all such equivalent processes. The use of the ALD coatings can reduce permeation by many orders of magnitude at thicknesses of tens of nanometers with low concentrations of coating defects. These thin coatings preserve the flexibility and transparency of the plastic substrate. Such articles are useful in container, electrical, and electronic applications. However, such protective layers also cause additional problems with light trapping in the layers since they may be of lower index than the light-emitting organic layers.

A variety of techniques have been proposed to improve the out-coupling of light from thin-film light emitting devices. For example, diffraction gratings have been proposed to control the attributes of light emission from thin polymer films by inducing Bragg scattering of light that is guided laterally through the Emissive Layers; See "Modification Of Polymer Light Emission By Lateral Microstructure" by Safonov et al., Synthetic Metals 116, 2001, pp. 145-148, and "Bragg Scattering From Periodically Microstructured Light Emitting Diodes" by Lupton et al., Applied Physics Letters, Vol. 77, No. 21, Nov. 20, 2000, pp. 3340-3342. Brightness enhancement films having diffractive properties and surface and volume diffusers are described in WO2002/037568 entitled "Brightness and Contrast Enhancement of Direct View Emissive Displays" by Chou et al., published May 10, 2002. The use of micro-cavity techniques is also known; for example, see "Sharply Directed Emission In Organic Electroluminescent Diodes With An Optical-Microcavity Structure" by Tsutsui et al., Applied Physics Letters 65, No. 15, Oct. 10, 1994, pp. 1868-1870. However, none of these approaches cause all, or nearly all, of the light produced to be emitted from the device.

Chou, in WO2002/037580 and Liu et al. in U.S. patent Publication 2001/0026124, taught the use of a volume or surface scattering layer to improve light extraction. The scattering layer is applied next to the organic layers or on the outside surface of the glass substrate and has an optical index that matches these layers. Light emitted from the OLED device at higher than critical angle that would have otherwise been trapped can penetrate into the scattering layer and be scattered out of the device. The efficiency of the OLED device is thereby improved but still has deficiencies as explained below.

U.S. Pat. No. 6,787,796 entitled "Organic Electroluminescent Display Device And Method Of Manufacturing The Same", issued Sep. 7, 2004 to Do et al., describes an organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light loss preventing layer having different refractive index areas is formed between layers of the organic EL device having a large difference in refractive index among the respective layers. U.S. Publication 2004/0217702 entitled "Light Extracting Designs For Organic Light Emitting Diodes", published Nov. 4, 2004 by Garner et al., similarly discloses use of microstructures to provide internal refractive index variations or internal or surface physical variations that function to perturb the propagation of internal waveguide modes within an OLED. When employed in a top-emitter embodiment, the use of an index-matched polymer adjacent the encapsulating cover is disclosed.

Light-scattering layers used externally to an OLED device are described in U.S. Publication 2005/0018431 entitled "Organic Electroluminescent Devices Having Improved Light Extraction", published Jan. 27, 2005, by Shiang and U.S. Pat. No. 5,955,837, issued Sep. 21, 1999, by Horikx, et al. These disclosures describe and define properties of scattering layers located on a substrate in detail. Likewise, U.S. Pat. No. 6,777,871, issued Aug. 17, 2004, by Duggal et al., describes the use of an output coupler comprising a composite layer having specific refractive indices and scattering properties. While useful for extracting light, this approach will only extract light that propagates in the substrate (illustrated with light ray 2) and will not extract light that propagates through the organic layers and electrodes (illustrated with light ray 3).

However, scattering techniques, by themselves, may cause light to pass through the light-absorbing material layers multiple times where they are absorbed and converted to heat. Moreover, trapped light may propagate a considerable distance horizontally through the cover, substrate, or organic layers before being scattered out of the device, thereby reducing the sharpness of the device in pixellated applications such as displays. For example, a pixellated bottom-emitting OLED device may include a plurality of independently controlled sub-pixels (as shown in FIG. 7) and a scattering layer (not shown in FIG. 7) located between the transparent first electrode 12 and the substrate 10. A light ray 2,3, or 4 emitted from the light-emitting layer may be scattered multiple times by scattering layer (not shown in FIG. 7), while traveling through the substrate 10, organic layer(s) 14, and transparent first electrode 12 before it is emitted from the device. When the light ray 2,3, or 4 is finally emitted from the device, the light ray 2,3, or 4 may have traveled a considerable distance through the various device layers from the original sub-pixel location where it originated to a remote sub-pixel where it is emitted, thus reducing sharpness. Most of the lateral travel occurs in the substrate 10, because that is by far the thickest layer in the package. Also, the amount of light emitted is reduced due to absorption of light in the various layers.

U.S. patent Publication 2004/0061136 entitled "Organic Light Emitting Device Having Enhanced Light Extraction Efficiency" by Tyan et al., describes an enhanced light extraction OLED device that includes a light scattering layer. In certain embodiments, a low index isolation layer (having an optical index substantially lower than that of the organic electroluminescent element) is employed adjacent to a reflective layer in combination with the light scattering layer to prevent low angle light from striking the reflective layer, and thereby minimize absorption losses due to multiple reflections from the reflective layer. The particular arrangements, however, may still result in reduced sharpness of the device.

Co-pending, commonly assigned U.S. application Ser. No. 11/065,082, filed Feb. 24, 2005, by Cok et al., describes the use of a transparent low-index layer having a refractive index lower than the refractive index of the encapsulating cover or substrate through which light is emitted and lower than the organic layers to enhance the sharpness of an OLED device having a scattering element. U.S. Publication 2005/0194896, published Sep. 8, 2005 by Sugita et al., describes a nano-structure layer for extracting radiated light from a light-emitting device together with a gap having a refractive index lower than an average refractive index of the emissive layer and nano-structure layer. Such disclosed designs, however, are difficult to manufacture, and may still not extract all of the available light in the presence of conventional encapsulation layers that may be employed to protect the OLED from environmental damage.

There is a need therefore for an improved organic light-emitting diode device structure that avoids the problems noted above and improves the lifetime, efficiency, and sharpness of the device.

SUMMARY OF THE INVENTION

The aforementioned need is met by the present invention, which provides a light-emitting OLED device that includes one or more light-emitting OLED elements. The OLED elements include spaced-apart electrodes with one or more light-emitting organic layers formed between the light emitting organic layers. At least one of the electrodes is a transparent electrode. A first hermetic inorganic encapsulating layer is formed over the transparent electrode opposite the light-emitting organic layer. A light-scattering layer is formed over the first hermetic inorganic encapsulating layer opposite the transparent electrode. An organic encapsulating layer is formed over the light-scattering layer opposite the first hermetic encapsulating layer. Finally, a second hermetic inorganic encapsulating layer is formed over the organic encapsulating layer opposite the light-scattering layer.

Another aspect of the present invention provides a method of forming a light-emitting OLED device that includes:
  a) providing a substrate;
  b) forming a light-emitting OLED element on the substrate;
  c) forming a first hermetic inorganic encapsulating layer on the light-emitting OLED element;
  d) forming a light-scattering layer on the first hermetic inorganic encapsulating layer;
  e) forming a second inorganic encapsulating layer on the light-scattering layer; and
  f) forming a second hermetic inorganic encapsulating layer on the organic encapsulating layer.

ADVANTAGES

The present invention has the advantage that it increases the light output from, improves the sharpness of, and improves the environmental protection for an OLED device.

It will be understood that the figures are not to scale since the individual layers are too thin and the thickness differences of various layers too great to permit depiction to scale.

DETAILED DESCRIPTION OF THE INVENTION

Figure 1:
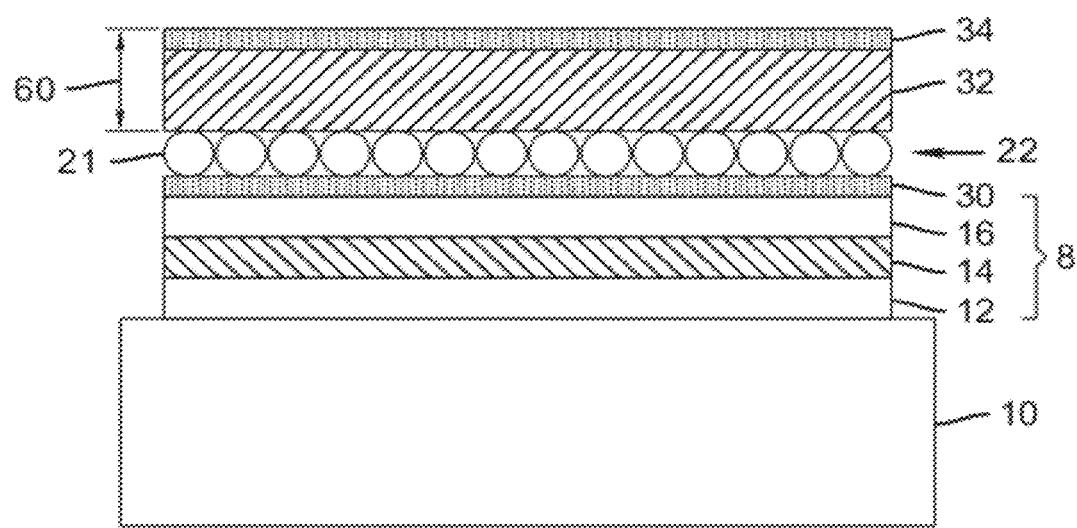
FIG. 1 illustrates a cross section of an OLED device having encapsulation layers and a light-scattering layer according to one embodiment of the present invention.

Referring to FIG. 1, in accordance with one embodiment of the present invention, a light-emitting OLED device, comprises one or more light-emitting OLED elements 8 including first and second spaced-apart electrodes 12, 16 with one or more light-emitting organic layers 14 formed there-between, at least one light-emitting organic layer 14 being a light-emitting layer, wherein at least one of the electrodes is a transparent electrode. A first hermetic inorganic encapsulating layer 30 is formed over the transparent electrode opposite the light-emitting organic layer 14. A scattering layer 22 is formed over the first hermetic inorganic encapsulating layer 30 opposite the transparent electrode. An organic encapsulating organic encapsulating layer 32 is formed over the scattering layer 22 opposite the first hermetic encapsulating layer 30 and a second hermetic inorganic encapsulating layer 34 is formed over the organic encapsulating layer 32 opposite the scattering layer 22. The various layers of the light-emitting device may be formed on a substrate 10. A hermetic inorganic encapsulating layer within the context of the present invention is a layer formed of inorganic materials that provides a moisture permeation rate of less than about $10^{-4}$ gm/m²/day, more preferably about $10^{-5}$ gm/m²/day, and even more preferably about $10^{-6}$ gm/m²/day. An organic encapsulating layer within the context of the present invention is a layer formed of organic materials that provides a relatively smooth surface compared to the surface of the light-scattering layer 22. The second encapsulating organic layer 32 may also provide a moisture permeation barrier and may preferably be thicker than the first and second hermetic inorganic encapsulating layers 30, 34. The second encapsulating organic layer 32 may also be colored and effectively provide a color filter for filtering light emitted from the OLED elements 8. Preferably, the encapsulating layers 30, 32, 34 in combination provide a moisture permeation rate of less than about $10^{-5}$ gm/m²/day, and even more preferably provide a moisture permeation rate of less than about $10^{-6}$ gm/m²/day, to adequately protect the light-emitting layer 14.

Transparent electrodes, for example comprising ITO, are known in the art. In a top-emitter embodiment of the present invention, the electrode 16 may be transparent and the electrode 12 may be reflective. Reflective electrodes, for example comprising aluminum, silver, or magnesium or alloys thereof are also known. Light-emitting organic layers, for example comprising OLED materials, are also known, and the formation of an OLED element comprising two electrodes 12, 16, and one-or-more light-emitting layers 14, is also known in the art.

Scattering layer 22 may comprise individual scattering particles 21. Such particles 21 may be dispersed in a binder to facilitate coating and adhesion. Light-scattering particles 21 may comprise, for example, particles of titanium dioxide. Preferably, such particles are at least 100 nm in diameter, and more preferably at least 300 nm, to optimize the scattering of visible light. The binder may be formed of, for example a polymeric material. The scattering layer 22 may include at least one material having a refractive index equal to or greater than the refractive index of the first hermetic inorganic encapsulation layer 30. The light-scattering layer 22 may comprise a solvent-coated layer, using spin, spray, curtain, slide, hopper, or inkjet coating.

Very thin layers of material suitable for the first hermetic inorganic encapsulating layer 30 may be formed of a variety of materials, for example metal or silicon oxides, indium tin oxide, aluminum oxide, silicon dioxide, or nitrides such as silicon nitride deposited in thin layers. In one embodiment of the present invention, the first hermetic inorganic encapsulating layer 30 formed adjacent to the electrode 16 and/or the second hermetic inorganic encapsulating layer 34 comprises at least one component layer formed by atomic layer deposition. For example, applicants have demonstrated an atomic layer deposition process whereby trimethylaluminum is first deposited over the transparent electrode using chemical vapor deposition followed by exposure to oxygen in the form of ozone. The aluminum and oxygen combine to form a very thin layer of $Al_2O_3$. Applicants have also demonstrated the use of ZnO and atmospheric pressure ALD processes. The process may then be repeated until a plurality of layers comprising a suitable thickness is achieved. Such a multi-layer is highly transparent and provides a thin-film encapsulating layer with very low permeation rates (for example on the order of $10^{-6}$ gm/m²/day). Subject to providing desired optical and encapsulation properties, the thin-film encapsulating layer may be less than 1 micron thick and preferably less than 400 nm and more preferably less than 100 nm. Other materials and processes may also be employed, for example as described in the "Handbook of Thin Film Process Technology" published by the Institute of Physics Publishing, 1995, edited by Glocker and Shah or as described in the "Handbook of Thin Film Materials" published by the Academic Press, Harcourt, Inc. 2002, edited by Nalwa (vol. 1, chapter 2 "Atomic Layer Deposition" by Ritala and Leskala).

Useful thin film encapsulating layer materials which may be deposited by atomic layer deposition can include Zn, ZnSe, $ZnS_{1-x}Se_x$, ZnTe, CaS, SrS, BaS, $SrS_{1-x}Se_x$, CdS, CdTe, MnTe, HgTe, $Hg_{1-x}Cd_xTe_x$, $Cd_{1-x}Mn_xTe$, AlN, GaN, InN, $SiN_x$, $Ta_3N_5$, TiN, TiSiN, TaN, NbN, MoN, $W_2N$, $Al_2O_3$, $TiO_2$, $ZrO_2$, $HfO_2$, $Ta_2O_5$, $Nb_2O_5$, $Y_2O_3$, MgO, $CeO_2$, $SiO_2$, $La_2O$, $SrTiO_3$, $BaTiO_3$, $Bi_xTi_y$, Oz, Indium Tin Oxide, Indium Oxide, $SnO_2$, NiO, $CO_3O_4$, MnOx, $LaCoO_3$, $LaNiO_3$, LaMnO3, $CaF_2$, $SrF_2$, $ZnF_2$, Si, Ge, Cu, Mo, Ta, W, $La_2S_3$, PbS, $In_2S_3$, $CuGaS_2$, and SiC (x, y, and z positive integers). In particular, ZnO or AlZnO may be employed. AlZnO may be preferred because it may provide additional conductivity to the electrode 16.

The organic encapsulating layer 32 may be comprised of materials such as parylene or polymeric materials such as resins. The organic encapsulating layer 32 may be formed through CVD processes, or spin-, spray-, or inkjet-coated. Applicants have demonstrated the use of such organic materials above light-scattering layers employing, for example, techniques such as CVD or spray coating.

Figure 7:
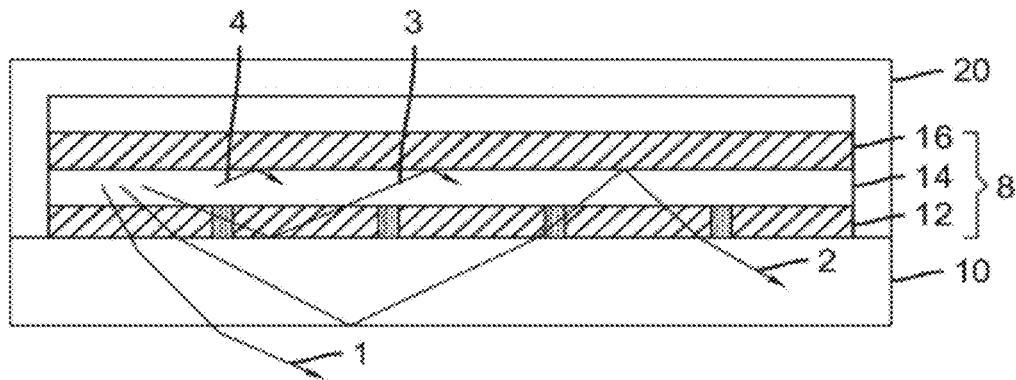
FIG. 7 illustrates the paths of various light rays within a cross section of a prior-art bottom-emitter OLED device.
Figure 8:
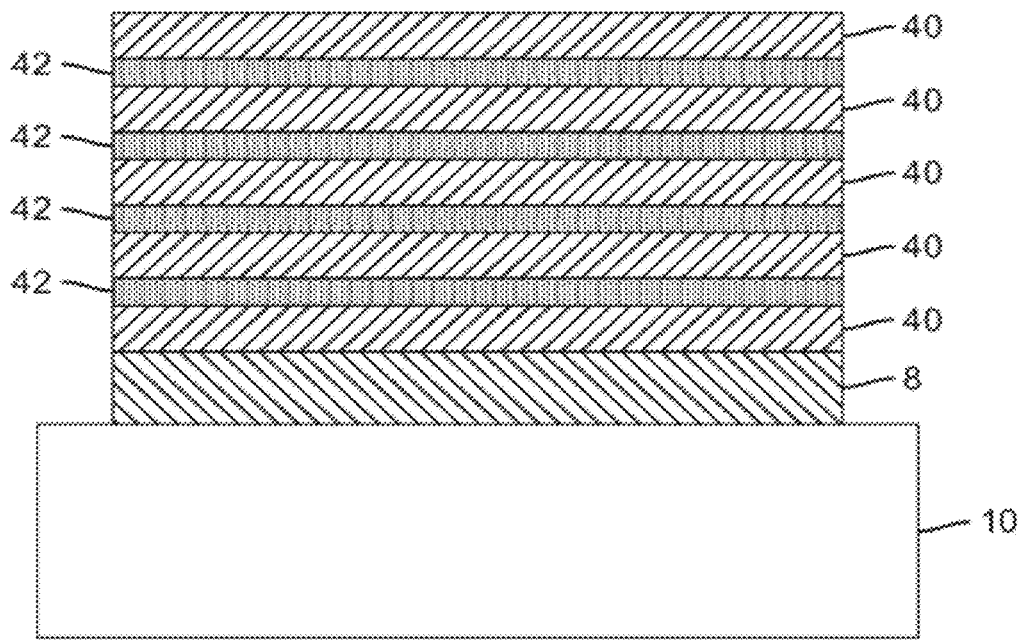
FIG. 8 illustrates a prior-art multi-layer encapsulation.

As taught in the prior art (FIG. 8), the inorganic layers in a multi-layer encapsulation coating form a relatively high-index optical barrier to light emitted from the relatively low-index light-emitting organic layer 14 through total internal reflection and as described with reference to FIG. 7. The use of a light-scattering layer 22 can scatter trapped light into escaping from a light-emitting organic layer 14. However, as demonstrated by applicant, locating the light-scattering layer 22 over a multi-layer encapsulation coating will not effectively extract light trapped within the OLED element (as illustrated with light-ray 3 in FIG. 7). As also demonstrated by applicant, scattering layers 22 may be dispersed within a solvent damaging to the light-emitting organic layer 14 and may degrade the transparent electrode and/or organic materials when deposited using typical deposition methods (e.g., organic or aqueous solvent coating processes) on the transparent electrode. Therefore, locating the light-scattering layer 22 in contact with electrode 16 may damage the light-emitting organic layer 14 or transparent electrode. Hence, as taught in the present invention and illustrated in FIG. 1, locating the light-scattering layer 22 over a hermetic inorganic encapsulating layer 30 but beneath an organic encapsulating 32 layer can enable the extraction of light otherwise trapped in the OLED element 8 while protecting the integrity of the light-emitting organic layer 14 from both environmental contamination and the light-scattering layer 22 deposition process.

Because the transparent electrode also typically has a relatively high optical index compared to the light-emitting organic layer 14, light may be trapped within the OLED element 8. Hence, according to one embodiment of the present invention, the transparent electrode has an optical index higher than the optical index of the light-emitting organic layer 14. The first hermetic inorganic encapsulating layer 30 may also have an optical index higher than the optical index of the light-emitting organic layer 14 and, preferably, has an optical index higher than the optical index of the electrode 16. Alternatively, or in addition, the first hermetic inorganic encapsulating layer 30 may have a thickness small enough to allow evanescent light rays to pass through, for example a thickness less than or equal to 500 nm, or preferably less than or equal to 100 nm, or more preferably less than or equal to 50 nm. Hence, the use of a relatively thinner hermetic inorganic encapsulating layer 30 with a relatively higher optical index than the optical index of the light-emitting organic layer 14 compared to a relatively thicker organic encapsulating layer with a relatively lower optical index than the optical index of the light-emitting organic layer 14 is preferred.

Figure 6A:
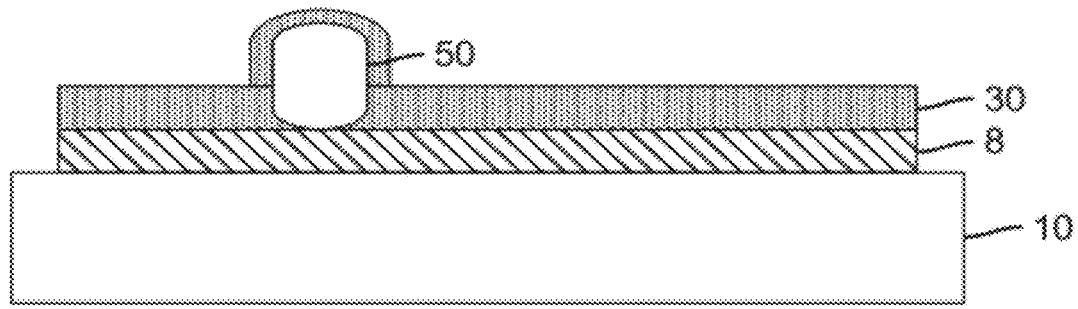
FIG. 6A is a cross section of a trapped contaminating particle according to an embodiment of the present invention.
Figure 6B:
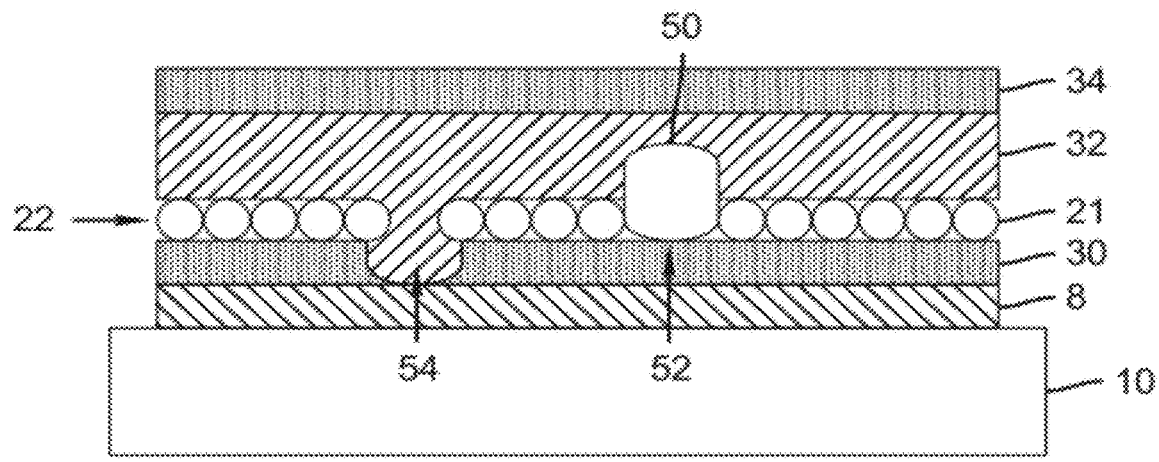
FIG. 6B is a cross section of a relocated trapped contaminating particle according to an embodiment of the present invention.

However, particulate contamination is frequently found in thin-film deposition systems. The use of a hermetic inorganic encapsulating layer 30, particularly one formed by ALD processes, may form a barrier over such particles and protect the light-emitting organic layer 14. Referring to FIG. 6A, a contaminating particle 50 is located over the OLED element 8 and is encapsulated by first hermetic inorganic encapsulating layer 30. However, as found by applicants, pin-holes may be present in hermetic inorganic encapsulating layer and, moreover, the deposition of a light-scattering layer 22 may dislodge a contaminating particle, thereby forming a hole in the hermetic inorganic encapsulating layer 30 and allowing contaminating elements, such as moisture, to corrode the light-emitting organic layer 14. Referring to FIG. 6B, the contaminating particle 50 is dislodged and relocated to location 52, leaving an opening 54 in the first hermetic inorganic encapsulating layer 30 and possibly in the light-scattering layer 22. Hence, according to the present invention, an organic encapsulating layer 32 is formed over the scattering layer 22 and is employed to trap any dislodged (and other) particles and also provides a relatively smooth surface over the scattering layer 22. While an inorganic layer might be employed, the time required to form a hermetic coating over and between the particles 21 of the light-scattering layer 22 is too large to permit efficient manufacturing, since the gases typically employed, for example in ALD processes, would have to seep between the particles to saturate the spaces internal to the light-scattering layer 22. Moreover, such inorganic layers are typically too thin to trap and hold particles effectively. Moreover, the refractive index difference between light-scattering particles 21 and hermetic inorganic encapsulation layers is smaller than may be desired, reducing the ability of the light-scattering layer 22 to scatter and extract light. Hence, according to an embodiment of the present invention, a thicker (for example one micron or greater) organic layer is employed in a relatively fast deposition process (compared to the formation of hermetic inorganic encapsulation layers) over the light-scattering layer to trap contaminating particles and to form a relatively smooth surface on which the second hermetic inorganic encapsulating layer 34 may be readily formed at a faster rate. Such relatively thick and smooth layers are readily formed by organic materials. Hence, the second organic encapsulation layer 32 can be of any useful thickness, possibly greater than one micron to cover particulate contaminants. The second hermetic inorganic encapsulation layer 34 provides an additional barrier to prevent contaminants from entering the OLED element 8 through the organic encapsulating layer 32, the light-scattering layer 22, and any pin-holes or holes 54 formed by dislodged contaminating particles 50.

Although the organic encapsulating layer 32 will typically have an optical index less than that of the first or second hermetic inorganic encapsulating layer 34, light-emitting layer 14, or transparent electrode, any light trapped in the organic encapsulating layer 32 by the second hermetic inorganic encapsulating layer 34 will be scattered out of the device by the light-scattering layer 22.

Figure 2:
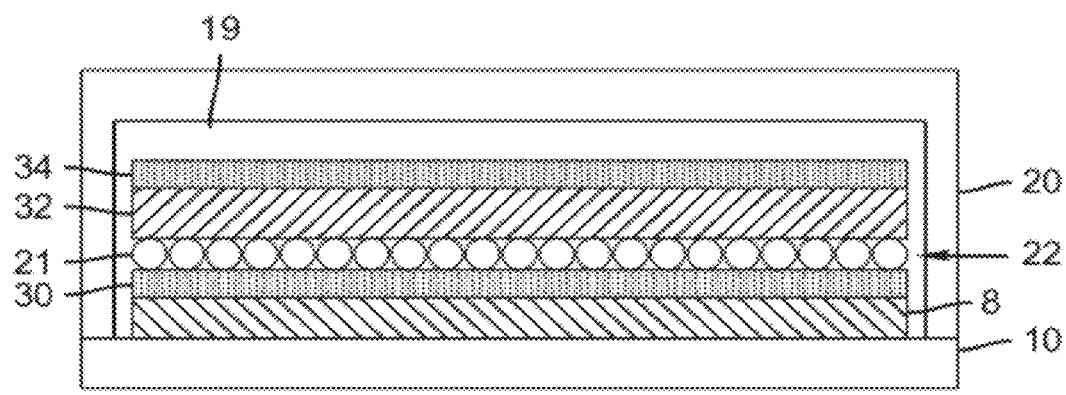
FIG. 2 illustrates a cross section of an OLED device having encapsulation layers, a light-scattering layer and a cover according to an alternative embodiment of the present invention.

Referring to FIG. 2, an embodiment of the present invention may include a cover 20 (for example comprising glass or plastic) provided over the second inorganic hermetic encapsulating layer 34 and forming a gap 19 between the cover 20 and the second inorganic hermetic encapsulating layer 34. The gap 19 may filled with a lower-index material or a vacuum or gas so that any light that enters the gap will not be trapped by the relatively higher-optical index cover 20. The transparent low-index element 19 is preferably at least one micron thick to ensure that emitted light properly propagates through the transparent low-index element and is transmitted through the encapsulating cover 20.

Figure 10:
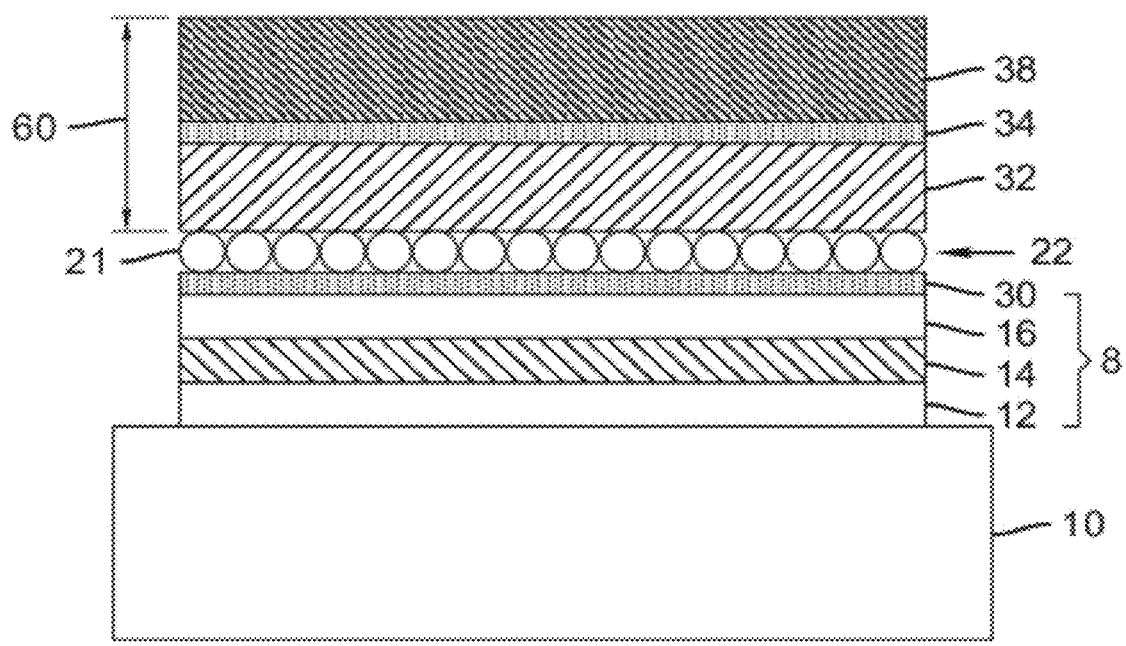
FIG. 10 is a cross-section of an embodiment of the present invention incorporating a cover layer.
Figure 11A:
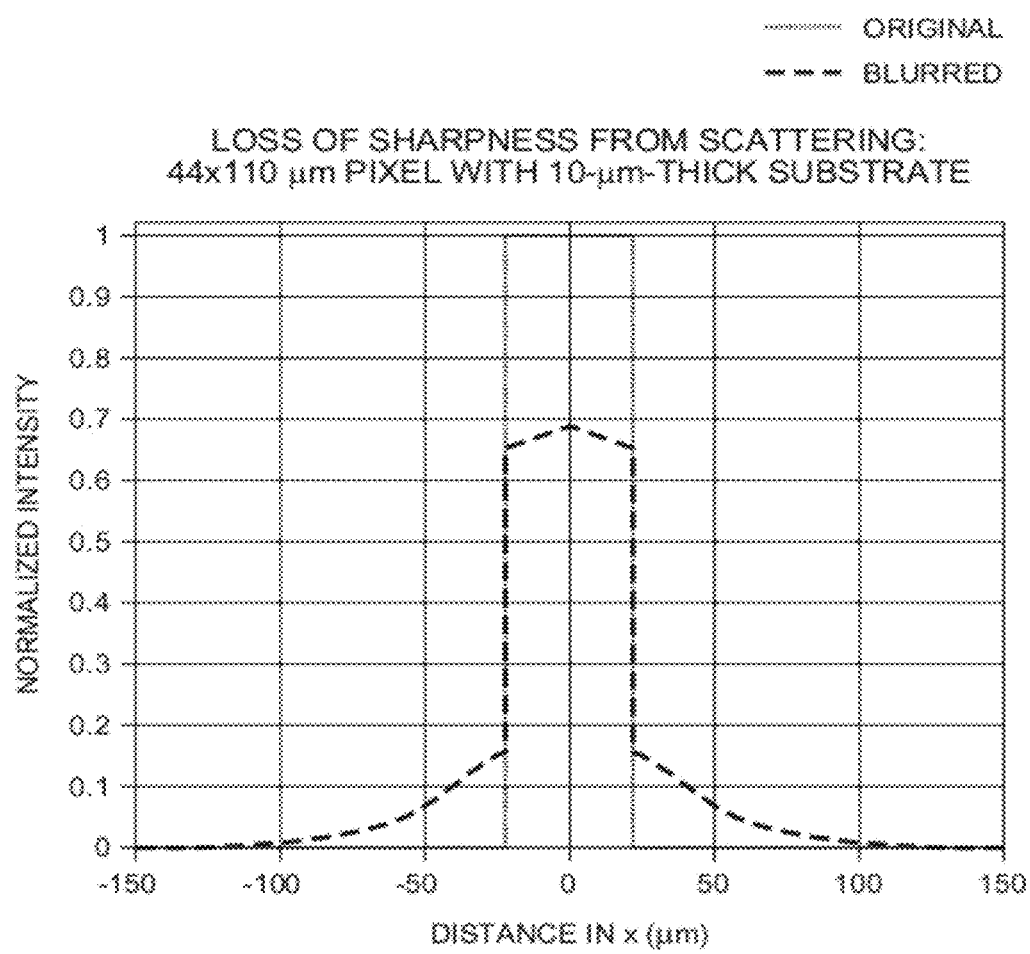
FIGS. 11A and 11B illustrate the sharpness of an embodiment of the present invention in different dimensions.
Figure 11B:
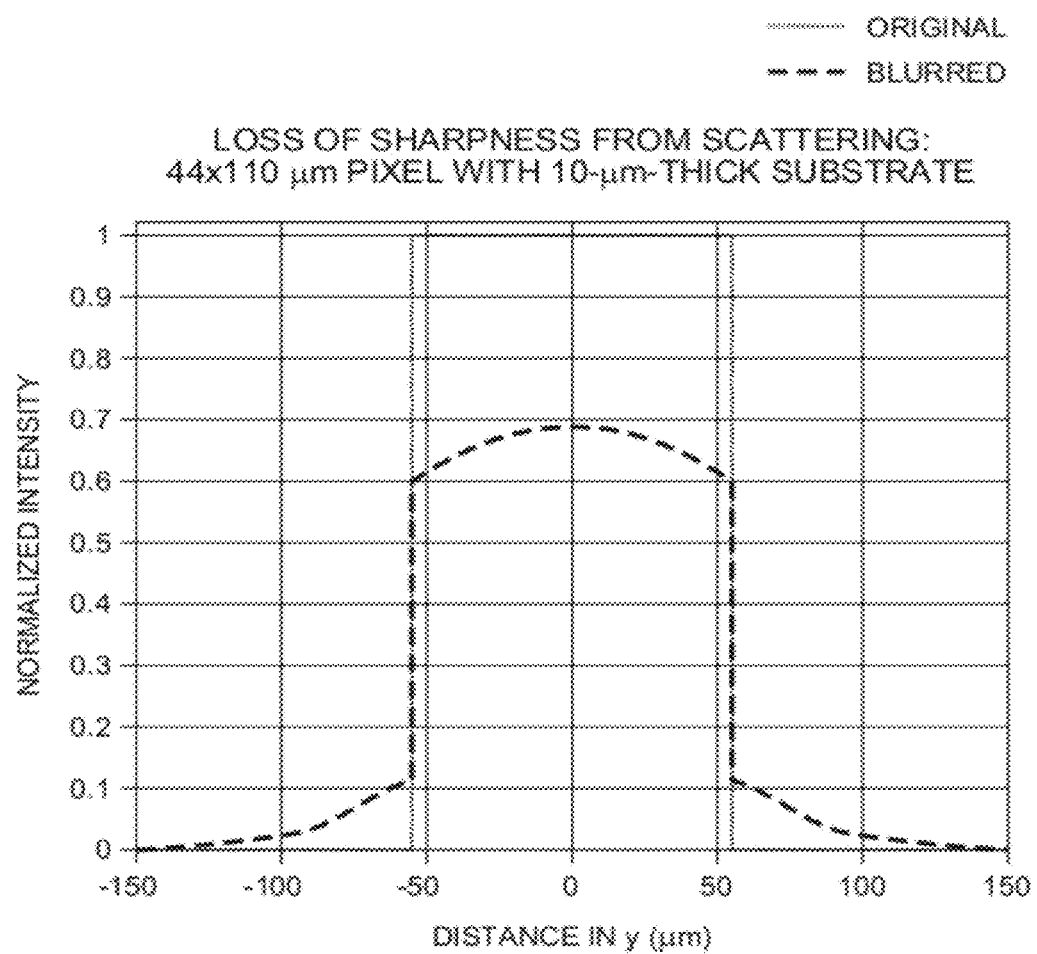
Figure 11C:
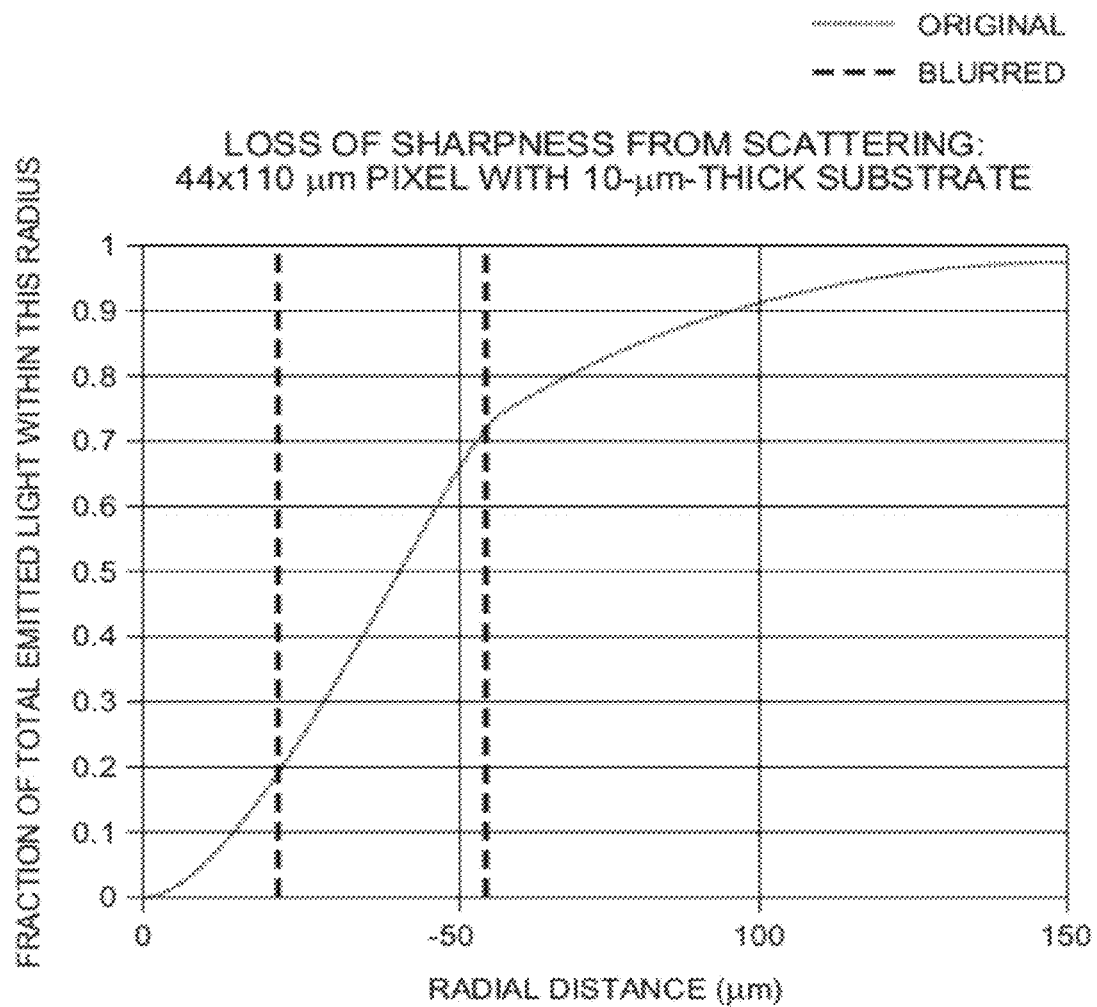
FIG. 11C illustrates the radial distribution of light of an embodiment of the present invention.

Alternatively, referring to FIG. 10, according to another embodiment of the present invention, a cover layer 36 comprising curable or non-curable liquid or solid materials may be formed over the second inorganic hermetic encapsulating layer 34. Preferably such a layer is relatively thin compared to the substrate 10 or a cover 20, for example less than or equal to 100 microns, 50 microns, 20 microns, or 10 microns, so that light scattered in the cover layer will not travel far before being scattered out of the device, thereby preserving the sharpness of a device having separate light-emitting elements and employing the present invention. Referring to FIGS. 11a-11c, the sharpness of a light-emitting element having a cover layer 38 (and including the organic and second inorganic encapsulating layers 32, 34) thickness 60 is illustrated. The example light-emitting element has a size of 110 microns by 44 microns (shown with a solid line labeled 'original' for the 44 micron dimension in FIG. 11a and the 110 micron dimension in FIG. 11b). The distribution of the actual light output is shown in these Figures with the dashed line labeled 'blurred'. Referring to FIG. 11c, the percentage of light output at a radial distance from the element is shown.

Figure 9:
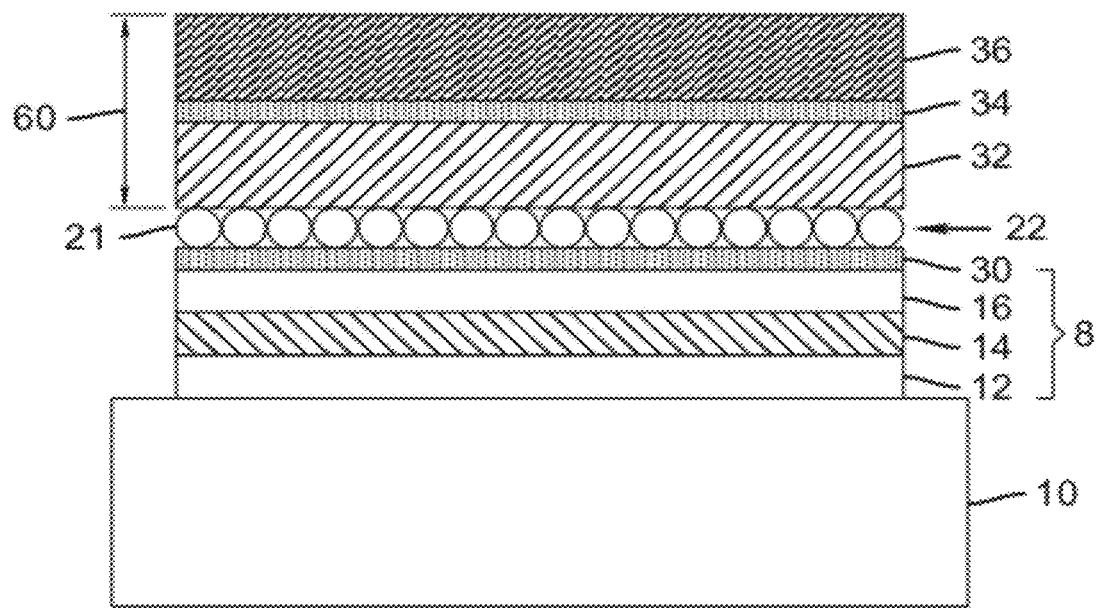
FIG. 9 is a cross-section of an embodiment of the present invention incorporating a color filter.

According to an alternative embodiment of the present invention, the second encapsulating organic layer 32 may be colored and effectively provide a color filter for filtering light emitted from the OLED elements 8. Alternatively, referring to FIG. 9, an additional color filter layer 36 may be formed over the second hermetic inorganic encapsulating layer to filter light emitted from the OLED elements 8. This embodiment is useful, for example, when the OLED elements 8 emit white light and a full-color display device is desired or when improved color purity is desired.

In various embodiments of the present invention, the first and/or second hermetic inorganic encapsulating layers are formed from zinc oxide, aluminum oxide, aluminum zinc oxide, doped zinc oxide, aluminum oxide, silicon oxide, or silicon nitride. In a further embodiment of the present invention, the first hermetic inorganic encapsulating layer may be electrically conductive, for example employing ITO or AlZnO. The first and/or second hermetic inorganic encapsulating layers 30, 34 may be deposited by ALD processes, to form a hermetic layer. The organic encapsulating layer 32 may comprise polymers, resins, and may comprise parylene.

To enhance the ability of the organic encapsulating layer 32 to trap and fix particles in place, the organic encapsulating layer may have a thickness of greater than 250 nm or a thickness of greater than 500 nm or a thickness of greater than 1 micron.

According to embodiments of the present invention, a method of forming a light-emitting OLED device may comprise the steps of providing a substrate; forming a light-emitting OLED element on the substrate; forming a first hermetic inorganic encapsulating layer on the light-emitting OLED element; forming a light-scattering layer on the first hermetic inorganic encapsulating layer; forming a second inorganic encapsulating layer on the light-scattering layer; and forming a second hermetic inorganic encapsulating layer on the organic encapsulating layer. The step of forming a first hermetic inorganic encapsulating layer on the light-emitting element may trap particles under the first hermetic inorganic encapsulating layer, while the step of forming a scattering layer may disturb the location of the trapped particles, and the step of forming the organic encapsulating layer may fix the trapped particles in the disturbed location.

Figure 3A:
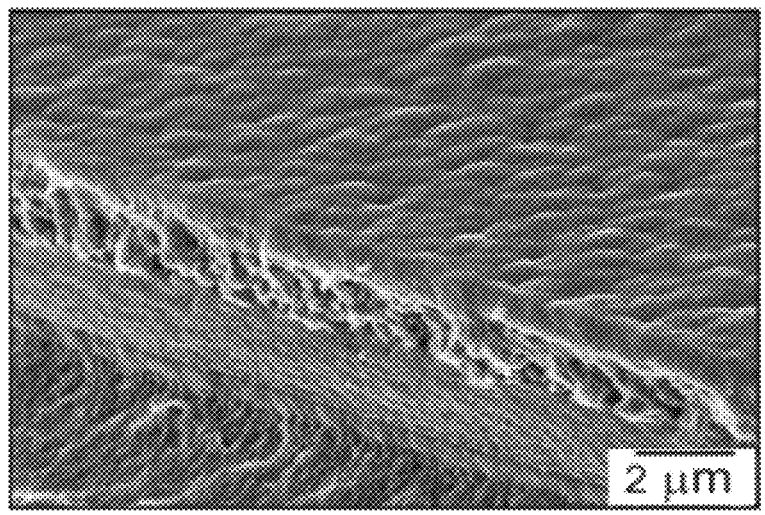
FIGS. 3A and 3B are microscopic images of an organic encapsulation layer formed over a light-scattering layer.
Figure 3B:
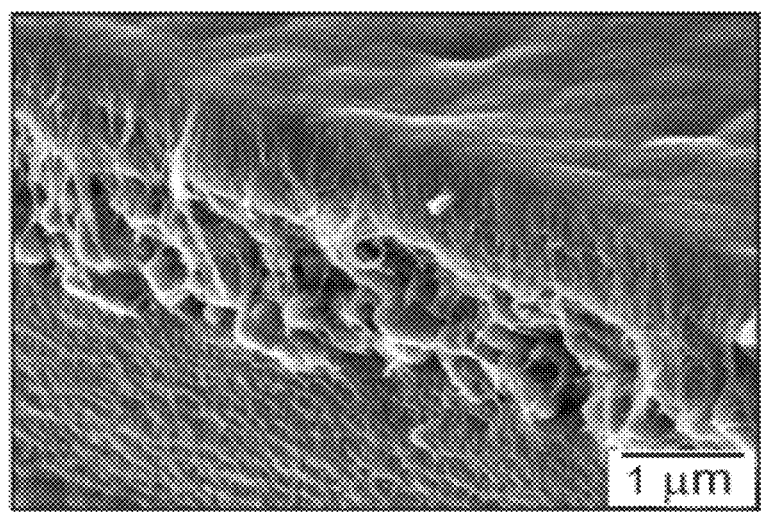
Figure 4:
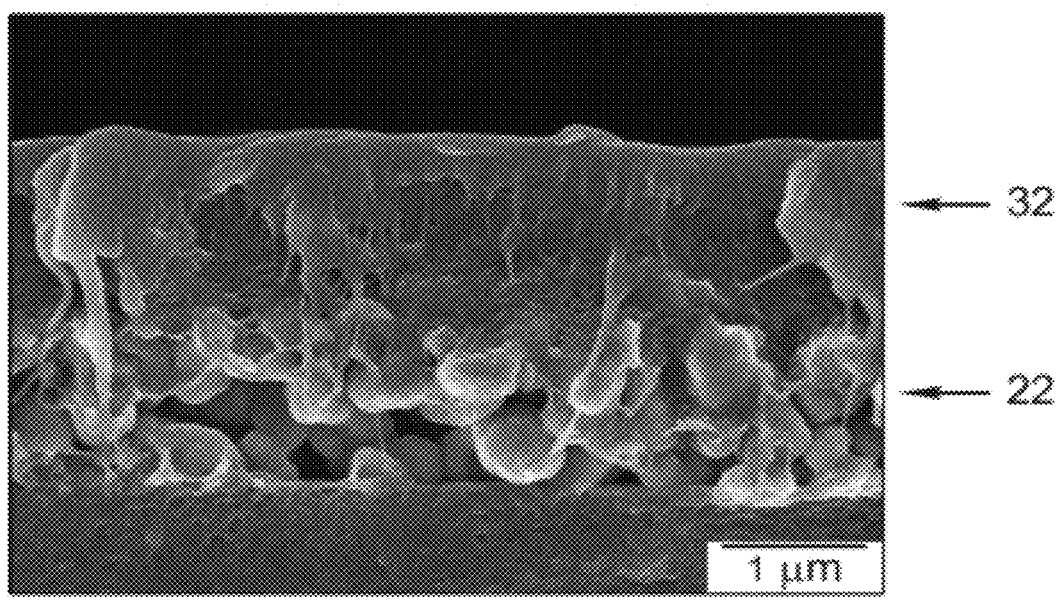
FIG. 4 is a microscopic cross-sectional image of an organic encapsulation layer formed over a light-scattering layer.
Figure 5:
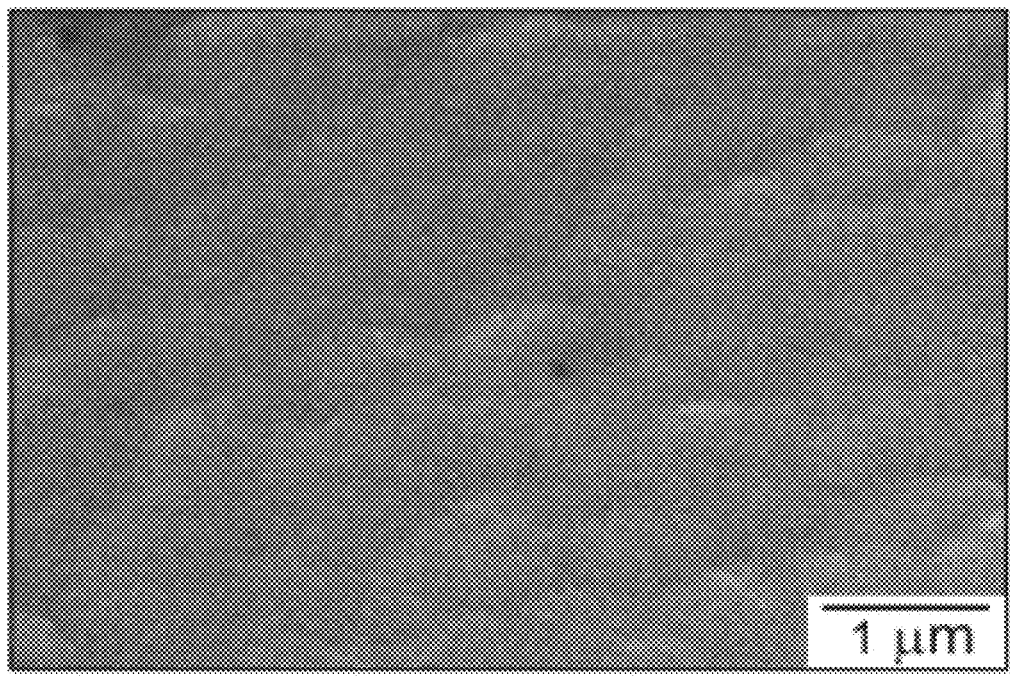
FIG. 5 is a microscopic top-view image of an organic encapsulation layer formed over a light-scattering layer.

Applicants have constructed suitable encapsulation layers as taught in the present invention. Referring to FIGS. 3A and 3B, a view of an organic layer formed over a scattering layer is shown. As can be clearly seen from the cross-section of FIG. 4, the organic encapsulating layer 32 materials have not penetrated the scattering layer 22, thereby maintaining the light-extraction efficiency of the light-scattering layer 22. Moreover, as shown in the top view of FIG. 5, the organic encapsulation layer 32 forms a relatively smooth surface that can be readily employed for forming a second hermetic inorganic encapsulation layer 34 at a useful rate as taught in the present invention.

The present invention may operate as follows. Upon the application of a voltage across the electrodes 12 and 16, light is emitted by the organic layer(s) 14 through which current passes. This light is emitted in all directions. Light that would have been trapped in the organic layer(s) 14, transparent electrode, and first hermetic inorganic encapsulating layer 30 is scattered by scattering layer 22. The first hermetic inorganic encapsulating layer 30 preferably has an optical index higher than that of the light-emitting layer 14 and/or is sufficiently thin that light enters the first hermetic inorganic encapsulating layer 30 and is not trapped solely in the transparent electrode and light-emitting layer 14. If a thicker layer is employed, some light may be trapped within the organic layer(s) 14 and transparent electrode 12, depending on the relative optical indices of the materials in the respective layers relative to the first hermetic inorganic encapsulating layer 30. Scattered light may then be emitted into the organic encapsulating layer 32 and second hermetic inorganic encapsulating layer 34 at such an angle that it escapes into the low-index gap 19. Once in the low-index gap 19, the light may pass into the cover 20 but cannot be trapped there since the cover 20 has an optical index higher than that of the low-index gap 19. Light emitted into the encapsulating layers 32, 34, at a higher angle and that does not pass into the low-index gap 19, will be reflected from the interface between the second hermetic inorganic encapsulating layer 34 and the low-index gap 19 and be redirected again by the scattering layer 22. Scattered light that is directed toward the reflective electrode will be reflected from the electrode and redirected again by the scattering layer 22. In this fashion, light will either be emitted from the OLED device or redirected repeatedly by the scattering layer 22 until the light is emitted from the OLED device. It is preferred that the various layers 14, 16, 22, 30, 32, and 34 be as transparent as possible and the reflective electrode be as reflective as possible to minimize the absorption of light within the OLED device.

In preferred embodiments, the cover 20 and substrate 10 may comprise glass or plastic with typical refractive indices of between 1.4 and 1.6. The transparent low-index element 19 may comprise a solid layer of optically transparent material, a void, or a gap. Voids or gaps may be a vacuum or filled with an optically transparent gas or liquid material. For example air, nitrogen, helium, or argon all have a refractive index of between 1.0 and 1.1 and may be employed. Lower index solids which may be employed include fluorocarbon or MgF, each having indices less than 1.4. Any gas employed is preferably inert. Reflective electrodes are preferably made of metal (for example aluminum, silver, or magnesium) or metal alloys. Transparent electrodes are preferably made of transparent conductive materials, for example indium tin oxide (ITO) or other metal oxides. The light-emitting layers 14 may comprise organic materials known in the art, for example, hole-injection, hole-transport, light-emitting, electron-injection, and/or electron-transport layers. Such organic material layers are well known in the OLED art. The organic material layers typically have a refractive index of between 1.6 and 1.9, while indium tin oxide has a refractive index of approximately 1.8-2.1. Hence, the various layers in the OLED element 8 have a refractive index range of 1.6 to 2.1. Of course, the refractive indices of various materials may be dependent on the wavelength of light passing through them, so the refractive index values cited here for these materials are only approximate. In any case, the transparent low-index element 19 preferably has a refractive index at least 0.1 lower than that of each of the first refractive index range and the second refractive index at the desired wavelength for the OLED emitter.

Scattering layer 22 may comprise a volume scattering layer or a surface scattering layer. In certain embodiments, e.g., scattering layer 22 may comprise materials having at least two different refractive indices. The scattering layer 22 may comprise, e.g., a matrix of lower refractive index and scattering particles 21 with a higher refractive index. Alternatively, the matrix may have a higher refractive index and the scattering particles 21 may have a lower refractive index. For example, the matrix may comprise silicon dioxide or cross-linked resin having indices of approximately 1.5, or silicon nitride with a much higher index of refraction. If scattering layer 22 has a thickness greater than one-tenth part of the wavelength of the emitted light, then it is desirable for the index of refraction of at least one material in the scattering layer 22 to be approximately equal to or greater than the index of refraction of the light-emitting layer 14. This is to insure that all of the light trapped in the organic layers 14 and transparent electrode can experience the direction altering effects of scattering layer 22. If scattering layer 22 has a thickness less than one-tenth part of the wavelength of the emitted light, then the materials in the scattering layer need not have such a preference for their refractive indices.

The scattering layer 22 can employ a variety of materials. For example, randomly located particles of titanium dioxide may be employed in a matrix of polymeric material. Alternatively, a more structured arrangement employing ITO, silicon oxides, or silicon nitrides may be used. In a further embodiment, the refractive materials may be incorporated into the electrode itself so that the electrode is a scattering layer. Shapes of refractive elements may be cylindrical, rectangular, or spherical, but it is understood that the shape is not limited thereto. The difference in refractive indices between materials in the scattering layer 22 may be, for example, from 0.3 to 3, and a large difference is generally desired. The thickness of the scattering layer, or size of features in, or on the surface of, a scattering layer may be, for example, 0.03 to 50 µm. It is generally preferred to avoid diffractive effects in the scattering layer. Such effects may be avoided, for example, by locating features randomly or by ensuring that the sizes or distribution of the refractive elements are not the same as the wavelength of the color of light emitted by the device from the light-emitting area.

Materials of the light scattering layer 22 can include organic materials (for example polymers or electrically conductive polymers) or inorganic materials. The organic materials may include, e.g., one or more of polythiophene, PEDOT, PET, or PEN. The inorganic materials may include, e.g., one or more of $SiO_x$ (x>1), $SiN_x$ (x>1), $Si_3N_4$, $TiO_2$, MgO, ZnO, $Al_2O_3$, $SnO_2$, $In_2O_3$, $MgF_2$, and $CaF_2$. The scattering layer 22 may comprise, for example, silicon oxides and silicon nitrides having a refractive index of 1.6 to 1.8 and doped with titanium dioxide having a refractive index of 2.5 to 3. Polymeric materials having refractive indices in the range of 1.4 to 1.6 may be employed having a dispersion of refractive elements of material with a higher refractive index, for example titanium dioxide. The scattering layer may be colored, to filter the emitted light.

Conventional lithographic means can be used to create the scattering layer using, for example, photo-resist, mask exposures, and etching as known in the art. Alternatively, the scattering layer may be sputtered or a coating may be employed in which a liquid, for example polymer having a dispersion of titanium dioxide, may form a scattering layer 22.

Whenever light crosses an interface between two layers of differing index (except for the case of total internal reflection), a portion of the light is reflected and another portion is refracted. Unwanted reflections can be reduced by the application of standard thin anti-reflection layers. Use of anti-reflection layers may be particularly useful on both sides of the cover 20.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. In addition to employing encapsulation layers as described herein, cover 20 may be an encapsulating edge sealed cover as is known in the art. Methods for edged encapsulation and desiccation include, but are not limited to, e.g., those described in U.S. Pat. No. 6,226,890 issued May 8, 2001 to Boroson et al.

OLED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

Parts List

| | |
|---|---|
| 1, 2, 3, 4 | light rays |
| 8 | OLED element |
| 10 | substrate |
| 12 | reflective electrode |
| 14 | light-emitting organic layer(s) |
| 16 | transparent electrode |
| 19 | gap |
| 20 | cover |
| 21 | scattering particles |
| 22 | scattering layer |
| 30 | first hermetic inorganic encapsulating layer |
| 32 | organic encapsulating layer |
| 34 | second hermetic inorganic encapsulating layer |
| 36 | color filter layer |
| 38 | layer thickness |
| 40 | encapsulating layer |
| 42 | encapsulating layer |
| 50 | contaminating particle |
| 52 | first location of contaminating particle |
| 54 | second location of contaminating particle |
| 60 | cover layer |

The invention claimed is:

1. A light-emitting OLED device, comprising:
   one or more light-emitting OLED elements including first and second spaced-apart electrodes with one or more light-emitting organic layers formed there-between, wherein at least one of the electrodes is a transparent electrode;
   a first hermetic inorganic encapsulating layer formed over the transparent electrode opposite the light-emitting organic layer;
   a light-scattering layer formed over and directly contacting the first hermetic inorganic encapsulating layer opposite the transparent electrode;
   an organic encapsulating layer formed over and directly contacting the light-scattering layer opposite the first hermetic encapsulating layer;
   a second hermetic inorganic encapsulating layer formed over the organic encapsulating layer opposite the light-scattering layer.

2. The light-emitting OLED device of claim 1, wherein the organic encapsulating layer has an optical index less than the optical index of the first and/or second hermetic inorganic encapsulating layers.

3. The light-emitting OLED device of claim 1, wherein the organic encapsulating layer has an optical index less than the optical index of the transparent electrode.

4. The light-emitting OLED device of claim 1, wherein the first and/or second hermetic inorganic encapsulating layer has an optical index greater than the optical index of the transparent electrode.

5. The light-emitting OLED device of claim 1, further comprising:
   a substrate on which the light-emitting elements are formed; and
   a cover affixed to the substrate forming a gap between the cover and the second hermetic inorganic encapsulating layer.

6. The light-emitting OLED device of claim 1, further comprising a cover layer comprising a curable or non-curable solid or liquid material formed over the second hermetic inorganic encapsulating layer.

7. The light-emitting OLED device of claim 1, wherein the organic encapsulating layer and the second hermetic inorganic encapsulating layer formed over the scattering layer together have a thickness less than or equal to 10 microns.

8. The light-emitting OLED device of claim 1, wherein the organic encapsulating layer is a color filter or further comprising a color filter layer formed over the second hermetic inorganic encapsulating layer.

9. The light-emitting OLED device of claim 1, wherein the first hermetic inorganic encapsulating layer is less than 500 nm thick.

10. The light-emitting OLED device of claim 1, wherein the first and/or second hermetic inorganic encapsulating layer is formed of multiple layers of inorganic material.

11. The light-emitting OLED device of claim 1, wherein the first and/or second hermetic inorganic encapsulating layer is formed by an atomic layer deposition process.

12. The light-emitting OLED device of claim 1, wherein the first hermetic inorganic encapsulating layer is electrically conductive.

13. The light-emitting OLED device of claim 1, wherein the first and/or second hermetic inorganic encapsulating layers is formed from a metal oxide and/or metal nitride.

14. The light-emitting OLED device of claim 13, wherein the first and/or second hermetic inorganic encapsulating layers are formed from zinc oxide, aluminum oxide, aluminum zinc oxide, doped zinc oxide, silicon oxide, or silicon nitride.

15. The light-emitting OLED device of claim 1 wherein the organic encapsulating layer comprises parylene.

16. The light-emitting OLED device of claim 1, wherein the organic encapsulating layer has a thickness of greater than 250 nm.

17. The light-emitting OLED device of claim 1, wherein the scattering layer includes at least one material having a refractive index equal to or greater than the refractive index of the first hermetic inorganic encapsulation layer.

18. The light-emitting OLED device of claim 1, wherein the light scattering layer comprises a solvent-coated layer.

* * * * *